United States Patent [19]

Komatsu

[11] Patent Number: 4,824,799
[45] Date of Patent: Apr. 25, 1989

[54] METHOD OF MAKING A BIPOLAR SEMICONDUCTOR DEVICE

[75] Inventor: Shigeru Komatsu, Kitakyushu, Japan

[73] Assignee: Kabushiki Kaisha Toshiba, Kawasaki, Japan

[21] Appl. No.: 178,875

[22] Filed: Apr. 4, 1988

Related U.S. Application Data

[62] Division of Ser. No. 817,102, Jan. 8, 1986, abandoned.

[30] Foreign Application Priority Data

Jan. 17, 1985 [JP] Japan .................................. 60-6216

[51] Int. Cl.⁴ ....................... H01L 31/36; H01L 21/38
[52] U.S. Cl. ........................................ 437/162; 437/31; 437/41; 437/89; 437/90; 437/99; 437/228; 357/34; 357/59
[58] Field of Search ....................... 437/31, 41, 89, 90, 437/99, 192, 193, 228; 357/594, 34

[56] References Cited

U.S. PATENT DOCUMENTS

| | | | |
|---|---|---|---|
| 4,276,557 | 6/1981 | Levinstein et al. | 357/71 S |
| 4,338,618 | 7/1982 | Nishizawa | 357/92 |
| 4,433,470 | 2/1984 | Kameyama et al. | 357/34 |
| 4,495,512 | 1/1985 | Isaac et al. | 357/34 |
| 4,512,075 | 4/1985 | Vora | 357/34 |
| 4,663,831 | 5/1987 | Birrittella et al. | 357/59 H |
| 4,706,378 | 11/1987 | Havemann | 437/31 |
| 4,764,801 | 8/1988 | McLaughlin et al. | 357/59 H |

FOREIGN PATENT DOCUMENTS

| | | | |
|---|---|---|---|
| 0102075 | 3/1984 | European Pat. Off. | |
| 55-134964 | 10/1980 | Japan | 357/71 S |
| 59-126671 | 7/1984 | Japan | 357/49 |
| 0158173 | 7/1986 | Japan | 437/31 |

OTHER PUBLICATIONS

*IBM Technical Disclosure Bulletin*, vol. 25, No. 7B, Dec. 1982, pp. 4011–4015, "Reducing the Device Size of Polysilicon Base Transistor" by C. G. Jarmbotkar.
Nakashiba et al., "An Advanced PSA Technology for High-Speed Bipolar LSI," *IEEE Transactions on Electron Devices*, vol. ED-27, No. 8, Aug. 1980.
Wiedmann, "Status and Trends of I2L/MTL Technology," *IEDM Digest Technical Papers*, pp. 47–50, 1983.

*Primary Examiner*—Brian E. Hearn
*Assistant Examiner*—Tom Thomas
*Attorney, Agent, or Firm*—Finnegan, Henderson, Farabow, Garrett, & Dunner

[57] ABSTRACT

An n⁺-type buried layer is formed in the surface region of a p-type semiconductor substrate. Isulating films are formed on the semiconductor substrate. The insulating films have openings located above the buried layer. An n-type monocrystalline silicon layer is formed in one opening located above the buried layer. A base region is formed in the monocrystalline silicon layer. The base region defines a remaining portion of the monocrystalline silicon layer as a collector region. An emitter region is formed in the base region. A polycrystalline silicon layer is buried in the insulating films to have ohmic contact with the base region and serve as a portion of a base connection region. The polycrystalline silicon layer contains a p-type impurity and serves as an impurity diffusion source for the formation of an external base of the base region. An MoSi₂ layer is buried in the insulating films to have ohmic contact with the polycrystalline silicon layer and to serve as a portion of the base connection region, thereby reducing the base resistance. A conductive layer for connection with a collector is formed in another opening.

6 Claims, 5 Drawing Sheets

METHOD OF MAKING A BIPOLAR SEMICONDUCTOR DEVICE

BACKGROUND OF THE INVENTION

The present invention relates to an improvement in a bipolar semiconductor device and a method of manufacturing the same.

Various conventional techniques have been proposed to improve the high-speed, high-frequency characteristics of a bipolar semiconductor device. Examples of these techniques include selective epitaxy and a combination of a super self-aligned structure, wherein polycrystalline silicon is used as an electrode for connection with a base region, and trench isolation technique. The latter combination is described, e.g., in the following: "Gigabit Logic Bipolar Technology, Advanced Super Self-Aligned Process Technology", *Electronics Letters*, Vol. 19, No. 8 (1983); "1.25 μm Deep-Groove-Isolated Self-Aligned ECL Circuits", ISSCC82, IBM; and S. K. Wiedmann, "Status and Trends of I$^2$L/MTL Technology", *IEDM Tech. Dig.*, pp. 47–50 (1983). Selective epitaxy is described, e.g., in H. J. Voss et al., "Device Isolation Technology by Selective Low-Pressure Silicon Epitaxy", *IEDM Tech. Dig.*, pp. 35–38 (1983). N. Ohuchi et al., "A New Self-Aligned Transistor Structure for High-Speed and Low-Power Bipolar LSIs", *IEDM Tech. Dig.*, pp. 55–58 (1983) describes a technology using both techniques mentioned above.

A bipolar transistor of a super self-aligned structure has been proposed which uses polycrystalline silicon as an electrode for connection with the base. Such a bipolar transistor is described, e.g., in N. Sasaki et al., "Bipolar Process Technology Evaluation by 3-Dimensional Device Simulation", *IEDM Tech. Dig.*, pp. 546–549 (1983).

In the high-speed bipolar semiconductor devices described in the above texts, base resistance rbb influences the operation speed of the circuit most (i.e., it has the largest sensitivity coefficient) among device constants (see Sotomura and Yamazaki, "Development and Mass Production of Ultra High-Speed ECL Logic HD100K Series", Hitachi Heyoron, pp. 59–62 (1982)). Therefore, it is desirable to further reduce the base resistance rbb in order to improve the operation speed and high-frequency characteristics of the bipolar transistor.

When polycrystalline silicon is used as an electrode for connection with a base region, however, further micropatterning of presently available semiconductor devices is difficult since the sheet resistance of polycrystalline silicon is several tens to several hundreds of $\Omega/\square$.

According to another conventional technique, a high-melting metal or a silicide thereof such as MoSi$_2$, which has a low sheet resistance, is used in the super self-aligned structure as an electrode for connection with the base in place of polycrystalline silicon, thereby decreasing base resistance rbb. However, these techniques are not practical because ohmic contact between such asn alternative material and the base region is difficult to obtain. In addition, it is difficult to use these alternative materials as diffusion sources for the formation of external base regions.

SUMMARY OF THE INVENTION

It is an object of the present invention to provide a semiconductor device having a small base resistance and a method of manufacturing the same.

In order to achieve the above object, a semiconductor device according to the present invention comprises:

a semiconductor substrate of a first conductivity type;

a buried layer of a second conductivity type selectively formed in a surface region of the semiconductor substrate;

at least one insulating film formed on the semiconductor substrate and having openings;

a monocrystalline silicon layer of the second conductivity type formed in at least one of the openings and connected to the buried layer;

a region of the first conductivity type selectively formed in the monocrystalline silicon layer;

a region of the second conductivity type selectively formed in the region of the first conductivity type;

a semiconductor layer of the first conductivity type buried in the insulating film and connected to the region of the first conductivity type in the monocrystalline silicon layer; and a conductive layer buried in the insulating layer, connected to the semiconductor layer, and made of material having a higher conductivity that that of the semiconductor layer.

With the above structure, a portion of the base connection region (connection electrode) of a semiconductor device according to the present invention is made of a material such as high-melting metal or a silicide thereof, both of which have good conductivity. Resistance of the base connection region and hence the base resistance is thus greatly decreased. Therefore, high-speed, high-frequency characteristics can be greatly improved over conventional bipolar semiocnductor devices. In addition, the electrode for connection with the base can have substantial ohmic contact with the base region, and the base connection region can be used as a diffusion source for formation of the base. This benefit cannot be obtained by merely replacing a conventional base connection region with a high-melting metal.

DETAILED DESCRIPTION OF THE PREFERRED EMBODIMENT

A method of manufacturing a semiconductor device according to an embodiment of the present invention will be described with reference to FIGS. 1 to 14. In FIGS. 1 to 14, polycrystalline silicon portions are dotted to distinguish them from monocrystalline silicon portions.

(1) An n-type impurity such as antimony (Sb) is selectively diffused into part of p-type silicon substrate 1 with an impurity concentration of $10^{14}$ to $10^{15}$/cm$^2$ and a resistivity of 20 to 50 $\Omega$·cm to form n$^+$-type buried layer 3. Silicon oxide film 5 having a thickness of 0.5 to 1 μm is formed on the entire surface of the resultant structure by, e.g., a CVD method. A molybdenum silicide film (to be referred to as MoSi₂ film hereinafter) having a thickness of 0.5 to 2 μm is formed on the resultant structure by sputtering. The film is patterned to form MoSi₂ pattern 7, part of which is left to serve as part of a base connection electrode to be described later. Note that pattern 7 has a sheet resistance of about 2 $\Omega/\square$. The structure shown in FIG. 1 is thus obtained.

Figure 1:
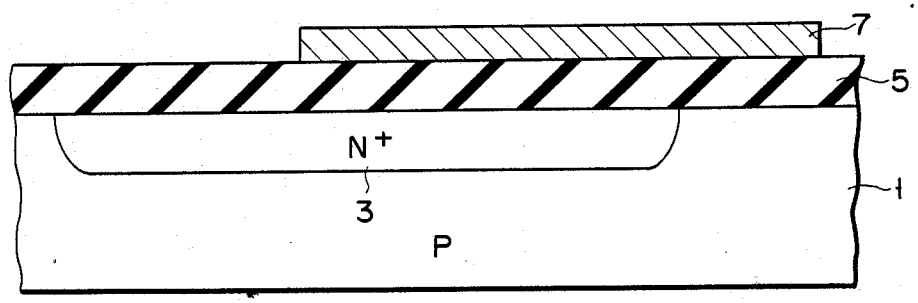
FIGS. 1 to 12 are sectional views showing steps of manufacturing a semiconductor device according to an embodiment of the present invention.
Figure 2:
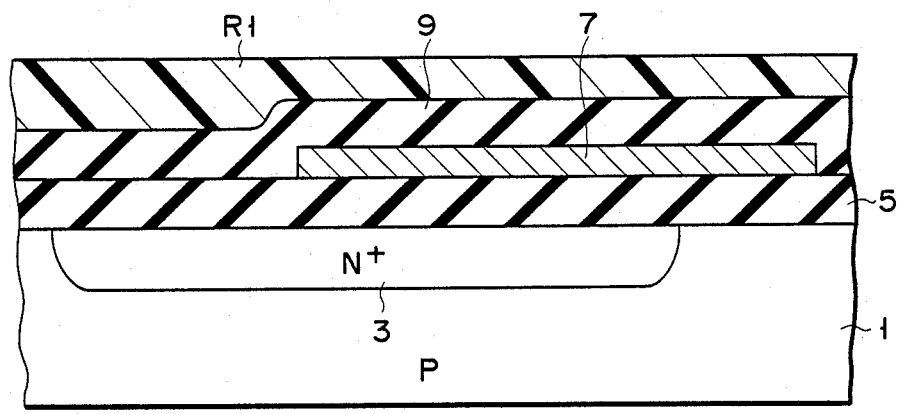

(2) Oxide film 9 of 1 to 2 μm thickness is deposited on the entire surface of the structure shown in FIG. 1 by, e.g., a CVD method. Photoresist R1 is applied thereon, resulting in the structure shown in FIG. 2.

Figure 3:
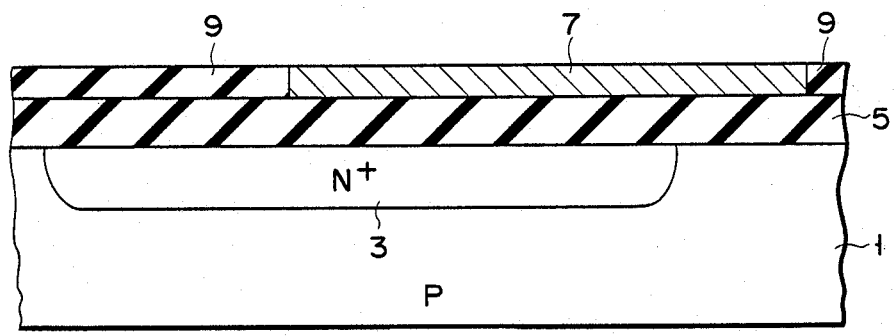

(3) Photoresist R1 and film 9 are etched using reactive ion etching (RIE) under the condition that the etching rate of photoresist R1 is virtually identical with that of film 9. The entire surfaces of photoresist R1 and film 9 are thus etched back so that the surfaces of pattern 7 and from 9 are virtually flush. This results in the structure shown in FIG. 3. Note that pattern 7 is buried in film 9 as shown in FIG. 3.

Figure 4:
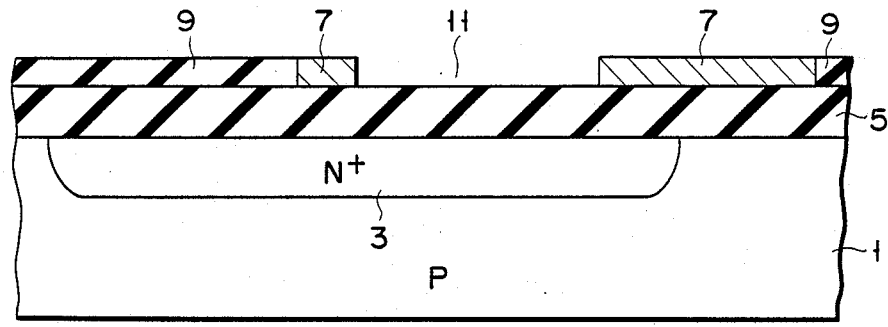

(4) The portion of pattern 7 corresponding to the prospective base-emitter formation region is selectively etched by RIE or chemical dry etching (CDE) to form opening 11 with a width of about 4 μm in film 7, resulting in the structure shown in FIG. 4.

Figure 5:
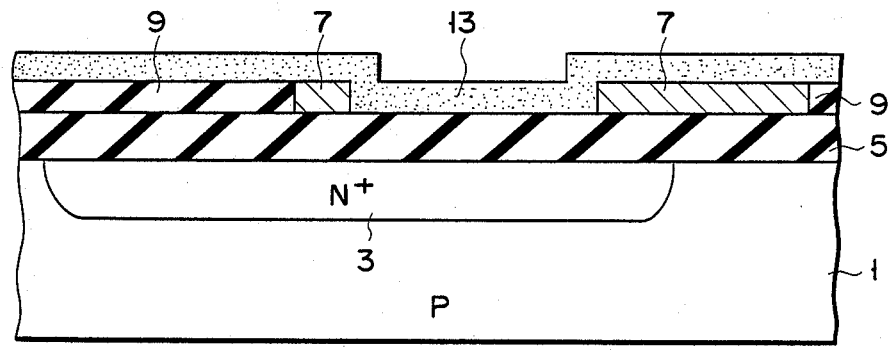
Figure 6:
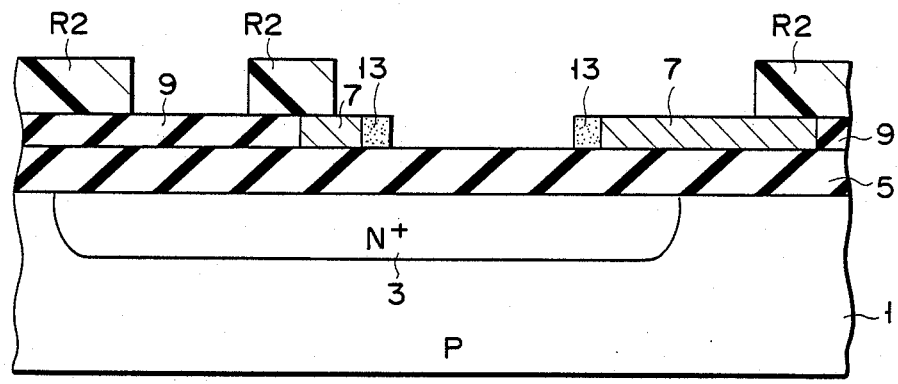
Figure 7:
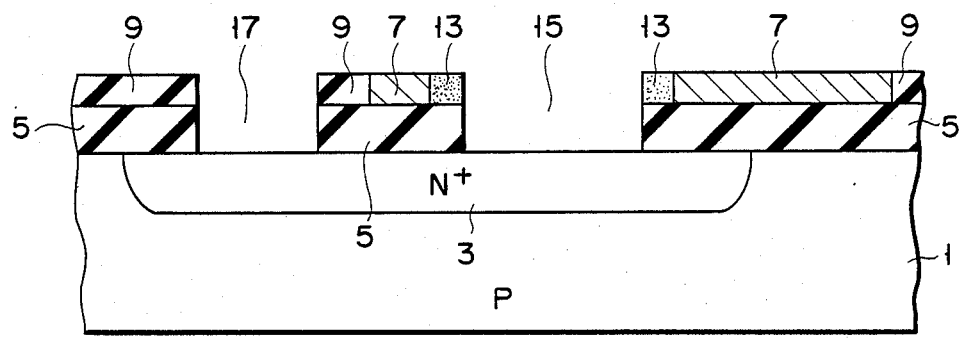

(5) Polycrystalline silicon film 13, having a thickness of 0.5 μm, is formed on the entire surface of the structure shown in FIG. 4 by, e.g., LP (low pressure) CVD. Boron is ion-implanted into film 13 at an acceleration energy of 30 to 40 keV and a dose of about $10^{15}$ to $10^{16}/cm^2$. The resultant structure is annealed in an N₂ atmosphere at 800° to 1,000° C., thereby activating the boron in film 13. In this case, the boron is diffused at a considerable speed and distributed uniformly in film 13. As a result, the sheet resistance of film 13 is about 50 to 500 $\Omega/\square$. The resultant structure is shown in FIG. 5.

(6) Polycrystalline silicon film pattern 13 is etched by RIE so that the only remaining portion lies on a side wall of pattern 7. This can be easily done by antisotropically etching film 13. Photoresist pattern R2 is formed on the resultant structure excluding at least a prospective collector formation region, resulting in the structure shown in FIG. 6.

(7) Film 5 is etched by RIE using photoresist pattern R2, remaining film 13, and pattern 7 as masks so that portions of layer 3 are exposed. Opening 15 is formed over a prospective base-emitter formation region and opening 17, over a prospective collector connection formation region. This results in the structure shown in FIG. 7.

(8) Monocrystalline silicon layers (epitaxial layers) 19 and 21 having thicknesses of about 1 μm are grown in openings 15 and 17 on layer 3 by selective epitaxy. In the same step, polycrystalline silicon layer 23, having a thickness of about 0.3 μm, is formed on films 9 and patterns 7 and 13. Layer 23 has a resistivity of 1.5 to 2 $\Omega\cdot cm$. Note that the dashed line in FIG. 8 indicates a boundary between the monocrystalline silicon layer and a the polycrystalline silicon layer, i.e., a transition region.

Figure 8:
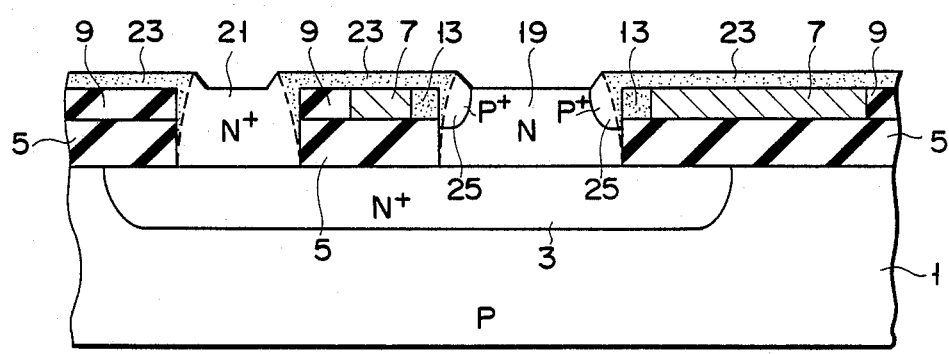
Figure 9:
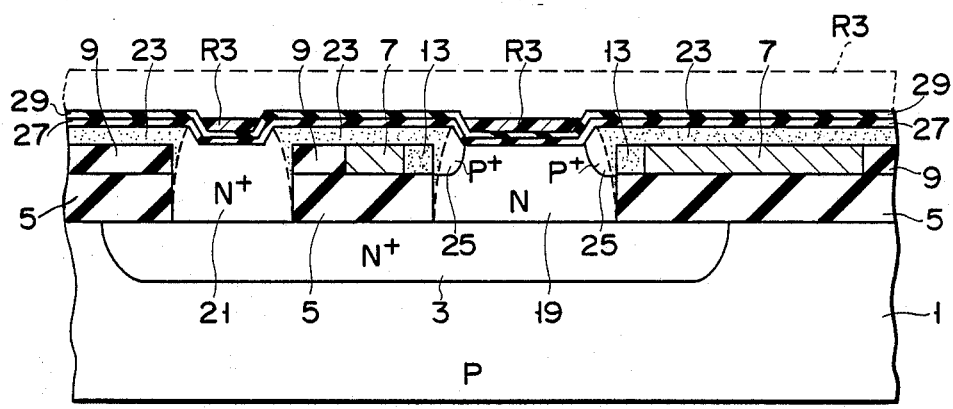

Phosphorus is ion-implanted in layer 21, which serves as a collector connection region. Annealing is then performed to form an n⁺-type collector connection region (21) reaching buried layer 3. Simultaneously, boron is diffused from remaining films 13 and 23 into layer 19 to form p-type graft (external) base region 25 having a width of about 0.5 μm. The resultant structure is shown in FIG. 8.

(9) Thermal oxidation is performed to form thermal oxide film 27 having a thickness of about 50 to 100 nm on the surfaces of layers 19, 21, and 23. Silicon nitride film 29 is formed on the entire surface of the resultant structure to a thickness of 50 to 100 nm by a CVD method. Photoresist R3 is applied thereon (as indicated by the dashed line in FIG. 9), and is baked to etch back the resultant structure. Photoresist pattern R3 thus remains only on the (recessed) portions of film 29 corresponding to layers 19 and 21, resulting in the structure shown in FIG. 9.

Figure 10:
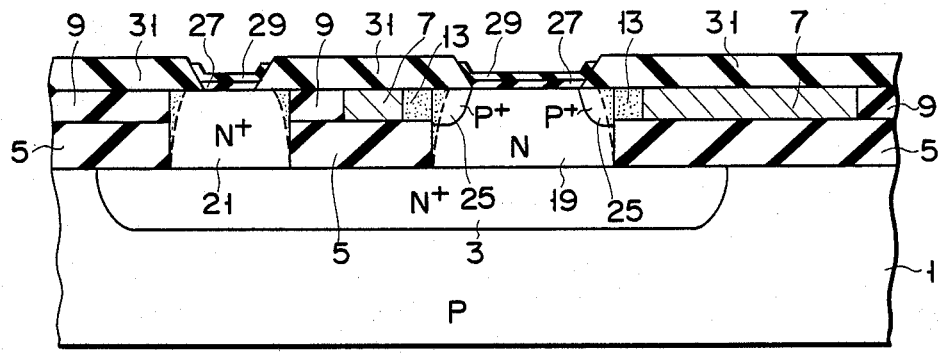

(10) Film 29 is removed by a CDE method using pattern R3 as a mask. Exposed portions of film 27 are removed using a dilute oxygen fluoride solution. Films 27 and 29 and pattern R3 thus remain only on layers 19 and 21. Pattern R3 is then removed. Using remaining film 29 as an oxidation resistant mask, selective oxidation is performed in a hydrogen combustion atmosphere at 950° to 1,000° C. to convert most of layer 23 and portions of the surface regions of layers 19 and 21 into thermal oxide film 31. The resultant structure is shown in FIG. 10.

Figure 11:
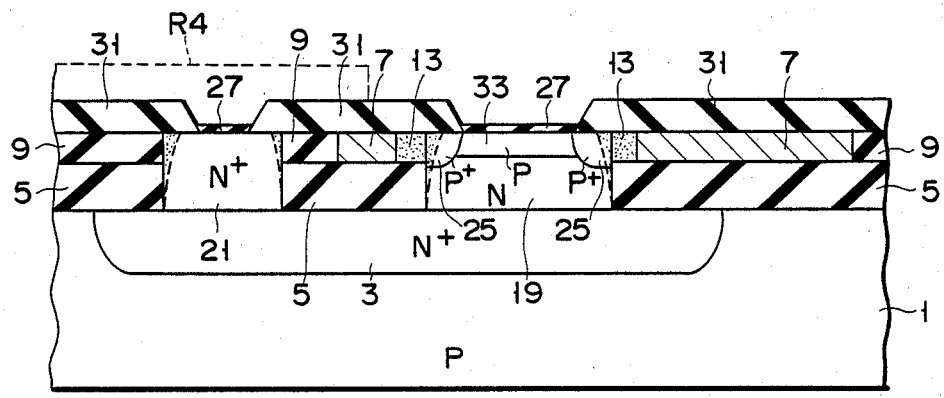

(11) Films 29 are removed. Photoresist pattern R4 is formed to cover collector connection region 21 (as indicated by the dashed line in FIG. 11). Using pattern R4 and film 31 as masks, boron is ion-implanted into layer 19 through films 27 at an acceleration energy of 30 to 40 keV and a dose of 1 to $2 \times 10^{14}/cm^2$. Pattern R4 is then removed. Annealing is performed at a temperature of 800° to 1,000° C. to activate the boron in monocrystalline silicon layer 19. P-type active base region 33 is thus formed. The remaining portion of layer 19 becomes the collector of the transistor. The resultant structure is shown in FIG. 11.

Figure 12:
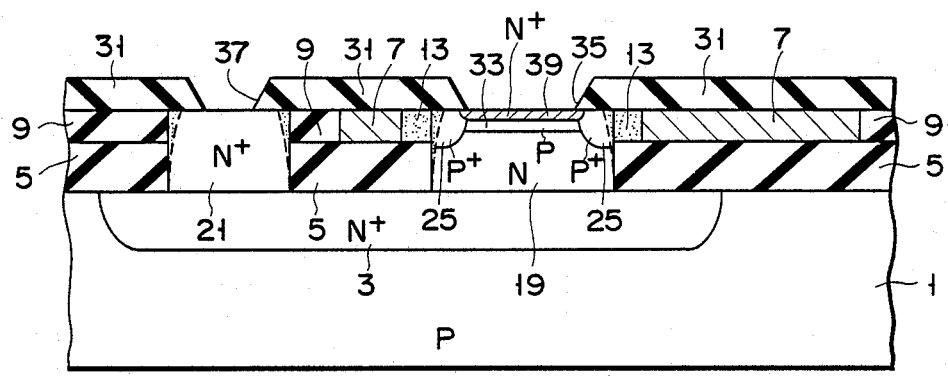

(12) Films 27 are washed out to form (exposed) emitter opening portion 35 and collector opening portion 37 having widths of about 2 μm. Arsenic or phosphorus is ion-implanted in the entire surface of the structure or selectively in opening 35 at an acceleration energy of 40 to 80 keV and a dose of $5 \times 10^{15}$ to $2 \times 10^{19}/cm^2$. Annealing is then performed in a dry oxide atmosphere to activate the impurity, thereby obtaining desired current amplification ratio $\beta$ and forming n⁺-type emitter region 39. The resultant structure is shown in FIG. 12.

Figure 13:
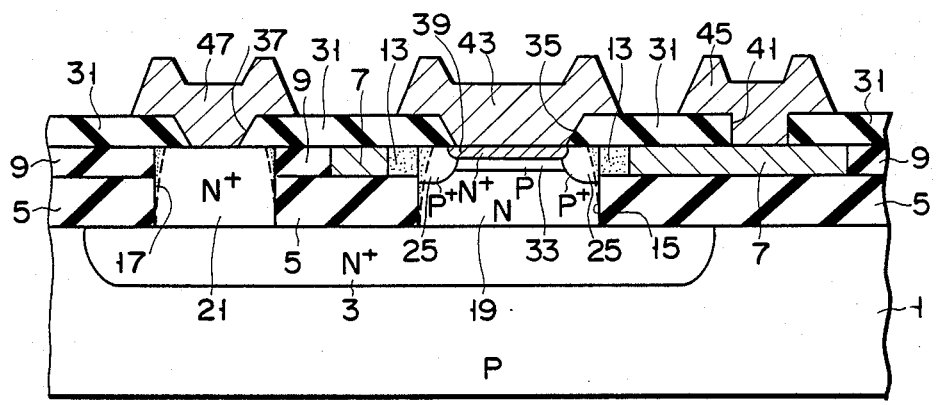
FIG. 13 is a sectional view of a semiconductor device according to an embodiment of the present invention which is manufactured by a method according to an embodiment of the present invention.
Figure 14:
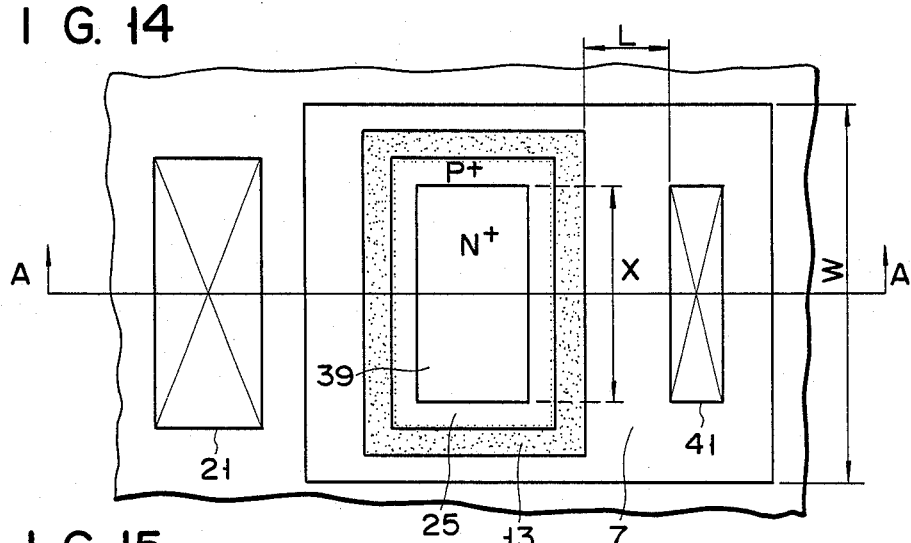
FIG. 14 is a plan view of the semiconductor device shown in FIG. 13.

(13) Part of film 31 is selectively etched to form opening 41 on pattern 7 for connection with the base. Pretreatment is performed for forming an electrode. An aluminum-silicon (1.2%) alloy film is formed on the entire surface of the resultant structure by sputtering. The alloy film is patterned and sintered to form emitter electrode 43, base electrode 45, and collector electrode 47. This results in an npn bipolar transistor, of which a sectional view is shown in FIG. 13 and a plan view is shown in FIG. 14. FIG. 14 shows positional relationships among respective portions, so portions unnecessary for the explanation are omitted for the sake of clarity. The sectional view of FIG. 13 is taken along the line A—A of FIG. 14.

By the above-mentioned steps, a semiconductor device is obtained which has: p-type semiconductor substrate 1; n⁺-type buried layer 3 formed in the surface region of substrate 1; insulating films 5 and 9 formed on substrate 1 and having openings 15 and 17; n⁺-type monocrystalline silicon layer 21 buried in opening 17 to be directly connected to buried layer 3; n-type monocrystalline silicon layer 19 which is buried in opening 15, is directly connected to layer 3, and serves as a collector connection region; p-type diffusion layers 25 and 33 selectively formed in layer 19 and serving as bases; n+-type diffusion layer 39 selectively formed in layers 25 and 33 and serving as an emitter; p-type polycrystalline silicon layer 13 which is formed on the surface regions of films 5 and 9 to be buried in films 5 and 9, is connected to regions 25 and 33, and serves as part of the base connection region; MoSi₂ layer 7 which is formed on the surface region of films 5 and 9, is connected to layer 13, and serves as part of the base connection region; emitter electrode 32; base electrode 45; and collector electrode 47.

In the bipolar transistor having the above structure, film 13 is provided between layer 19 and film 7 as a kind of buffer. Assume that most of the base region connection region (electrode) is constituted by pattern 7, which cannot easily maintain ohmic contact with layer 19. In this case, good ohmic contact can be obtained between graft base region 25 and film 7 because of the presence of film 13 therebetween. In addition, most of the base region connection region (electrode) is constituted by pattern 7, which has a small sheet resistance. Therefore, the resistance of the base connection region and hence the base resistance can be greatly reduced. High-speed and high-frequency characteristics of the bipolar semiconductor device are improved accordingly over conventional bipolar semiconductor devices. Layer 13 serves as a diffusion source for forming graft base region 25. In this manner, the structure of the present invention is more effective than that which would be obtained by merely replacing the polycrystalline silicon base connection region with an MoSi₂ base connection region.

The effect of reducing the base resistance will be described with reference to FIG. 14. Assume that emitter stripe length X is 4 μm, width W of film 7 is 8 μm, and distance L between pattern 13 and contact hole 41 for base electrode 45 is 4.5 μm.

In FIG. 14, assume that the sheet resistances of region 33 and region 25 are 1 kΩ/□ and 50 Ω/□, respectively, which are the same as those of a conventional bipolar semiconductor device. The device of the present invention is different from that of the conventional device in that pattern 7 replaces the polycrystalline silicon layer between film 13 and contact hole 41 for base electrode 45. Note that sheet resistance ρ1 of film 13 is 100 Ω/□ and sheet resistance ρ2 of pattern 7 is about 2 Ω/□. The decrease in base resistance rbb can thus be approximated as:

$$\Delta rbb = (\rho1 - \rho2)L/W \\ = 98 \times 4.5/8 \\ = 55 \, \Omega$$

In practice, the entire base region is surrounded by pattern 7 so that base resistance rbb is further reduced. A bipolar transistor having the structure of the present invention and one having the conventional structure (i.e., one in which the base connection region is made of polycrystalline silicon) were prepared, and the base resistances of both were compared. Base resistance rbb of the conventional device was 150 Ω whereas that of the present invention was 80 Ω, about half that of the conventional device. Note that the shorter emitter stripe length X, the larger the L/W ratio. Base resistance reduction is thus enhanced in this case.

Figure 15:
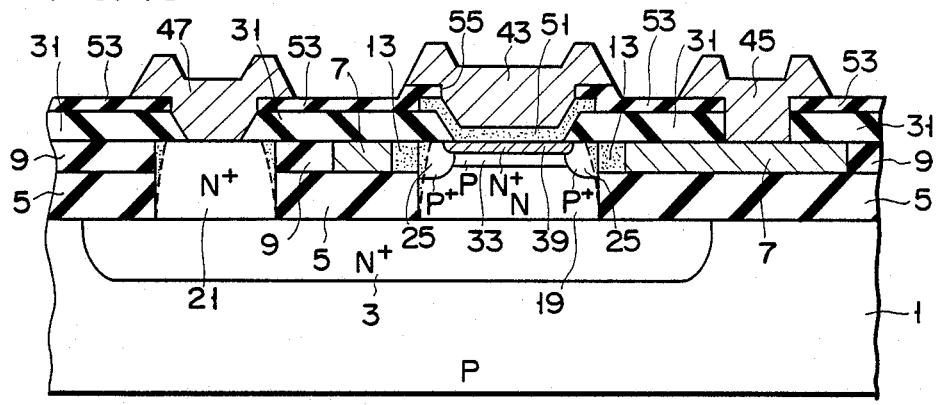
FIG. 15 is a sectional view of a semiconductor device according to another embodiment of the present invention.

In the above embodiment, a washed emitter technique is used to form region 39 and electrode 43. In devices obtained using the washed emitter technique, the base and the emitter may short-circuit. In order to prevent this, the semiconductor device may be manufactured in the following manner. Polycrystalline silicon film pattern 51, doped with an n-type impurity, is formed after the formation of active base region 33. Protection film 53 is deposited on the entire surface of the resultant structure. An impurity is diffused from pattern 51 to form emitter region 39. After the formation of contact holes 55, 57, and 59, emitter, base, and collector electrodes 43, 45, and 57 are formed. The resultant semiconductor device is shown in FIG. 15.

In the above embodiment, p-type polycrystalline silicon layer 13 is formed to serve as a p-type impurity diffusion source and allow ohmic contact between monocrystalline silicon and a high-melting metal. However, the present invention is not limited to polycrystalline silicon. If layer 13 is not used as an impurity diffusion source, it can be made of any conductive material which can maintain ohmic contact with both monocrystalline silicon nd a high-melting metal.

In the above embodiment, monocrystalline silicon constitutes the collector connection region. However, the present invention is not limited to this. High-melting metals such as Mo, Ti, and W or silicides thereof which are resistant to high-temperature annealing at about 1,200° C. can be used in place of monocrystalline silicon. Polycrystalline silicon can also be used.

An n-type impurity may be rediffused from buried layer 3 into monocrystalline silicon layer 19 during diffusion of an n-type impurity into monocrystalline silicon layer 21, thereby reducing the emitter-collector breakdown voltage. In order to prevent this, the collector connection region may be formed, e.g., by polycrystalline silicon, a high-melting metal, or a silicide thereof. Opening 15 is formed for the formation of the transistor, and monocrystalline silicon layer 19 is then grown.

The conductivity types of the respective portions of the semiconductor device according to the present invention are not limited to those employed in this embodiment. P- and n-type conductivity types can be exchanged to obtain the same effect. The present invention is not limited to a device having a single collector or a single emitter structure but can be applied to a device having a multi-emitter or multi-collector structure. The values indicated in the above embodiment are merely examples and should not be taken as fixed values.

What is claimed is:

1. A method of manufacturing a semiconductor device, comprising the steps of:

forming a buried layer of a second conductivity type in a surface region of a semiconductor substrate of a first conductivity type;

forming a first insulation film on said buried layer;

forming a metallic layer on said first insulation film, said metallic layer overlapping a portion of said buried layer;

forming a second insulation film on said first insulation film, said second insulation film overlapping an other portion of said buried layer;

forming a first opening in an area of said metallic layer located above said buried layer;

forming a polysilicon layer including an impurity of the first conductivity type in at least said opening;

etching said polysilicon layer to leave an annular polysilicon layer contacting a side wall of said metallic layer;

forming a second opening and a third opening, said second opening being located in a region excluding said metallic layer and penetrating said first insulation film and said second insulation film to reach said buried layer, and said third opening being formed using said annular polysilicon layer and said metallic layer as a mask and penetrating said first insulation film to reach said buried layer;

forming a conductive collector connection layer in said second opening;

growing a monocrystalline layer in said third opening, said monocrystalline silicon layer contacting said annular polysilicon layer, and diffusing said impurity included in said polysilicon layer into said monocrystalline silicon layer to form an external base region of the first conductivity type;

forming a base region of the first conductivity type within said monocrystalline silicon layer to contact said external base region, with a remaining region of the monocrystalline silicon layer of the second conductivity type forming a collector; and forming an emitter region of the second conductivity type within said base region.

2. The method according to claim 1, including the step of forming an emitter electrode electrically connected to said emitter region, a base electrode electrically connected to an upper surface of said metallic layer, and a collector electrode electrically connected to said conductive collector connection layer.

3. The method according to claim 1, wherein said conductive collector connection layer is formed of any one of a polysilicon, a monocrystalline silicon, and a high melting point.

4. The method according to claim 1, wherein said conductive collector connection layer is formed of a monocrystalline silicon layer including an impurity of the second conductivity type, said conductive collector connection layer being grown by the same process as said monocrystalline silicon layer in said third opening.

5. The method according to claim 1, wherein said conductive collector connection layer is formed of a monocrystalline silicon layer including an impurity of the second conductivity type, and wherein, after said collector connection layer is formed, said monocrystalline silicon layer is grown in the third opening.

6. A method of manufacturing a semiconductor device, comprising the steps of:

forming a first insulation film on a semiconductor body;

forming a metallic layer on said first insulation film;

forming an opening in said metallic layer;

forming an annular polysilicon layer, including an impurity of the first conductivity type, in said opening, said annular polysilicon layer contacting a side wall of said metallic layer;

forming a hole in said first insulation film using said annular polysilicon layer and said metallic layer as a mask, said hole penetrating said first insulation film to reach said buried layer;

growing a monocrystalline silicon layer in said hole, said monocrystalline silicon layer contacting said annular polysilicon layer, and diffusing said impurity included in said polysilicon layer into said monocrystalline silicon layer to form an external base region;

forming a base region of the first conductivity type within said monocrystalline silicon layer to contact said external base region, with a remaining region of the monocrystalline silicon layer of the second conductivity type forming a collector; and forming an emitter region of the second conductivity type within said base region.

* * * * *